US008383191B2

(12) United States Patent
Yoon

(10) Patent No.: US 8,383,191 B2
(45) Date of Patent: Feb. 26, 2013

(54) COLOR FILTER SUBSTRATE AND FABRICATING METHOD THEREOF

(75) Inventor: Sang Soon Yoon, Incheon (KR)

(73) Assignee: LG Display Co., Ltd., Seoul (KR)

( * ) Notice: Subject to any disclaimer, the term of this patent is extended or adjusted under 35 U.S.C. 154(b) by 137 days.

(21) Appl. No.: 12/860,999

(22) Filed: Aug. 23, 2010

(65) Prior Publication Data
US 2011/0042346 A1 Feb. 24, 2011

Related U.S. Application Data

(62) Division of application No. 11/442,163, filed on May 30, 2006, now Pat. No. 7,799,392.

(30) Foreign Application Priority Data

Dec. 8, 2005 (KR) .................. P2005-0119956

(51) Int. Cl.
B05D 5/12 (2006.01)
G02F 1/1347 (2006.01)
G03B 21/14 (2006.01)

(52) U.S. Cl. ............... 427/58; 349/80; 349/56; 353/84

(58) Field of Classification Search ............... 427/58, 427/64, 68, 69, 70
See application file for complete search history.

(56) References Cited

U.S. PATENT DOCUMENTS

| 5,908,585 | A | * | 6/1999 | Shibuta ................... 252/506 |
| 6,072,553 | A | | 6/2000 | Mitsui et al. | |
| 6,114,404 | A | | 9/2000 | Deeken et al. | |
| 6,988,925 | B2 | * | 1/2006 | Arthur et al. ................ 445/46 |
| 7,087,351 | B2 | * | 8/2006 | Aylward et al. ............. 430/20 |
| 7,259,106 | B2 | | 8/2007 | Jain | |
| 2001/0013914 | A1 | | 8/2001 | Lee | |
| 2002/0018163 | A1 | | 2/2002 | Yamamoto et al. | |
| 2003/0087179 | A1 | | 5/2003 | Iwasaki | |
| 2004/0127135 | A1 | | 7/2004 | Baek et al. | |
| 2004/0265550 | A1 | * | 12/2004 | Glatkowski et al. ........ 428/209 |
| 2005/0074954 | A1 | | 4/2005 | Yamanaka | |
| 2005/0095514 | A1 | | 5/2005 | Lee et al. | |
| 2005/0099578 | A1 | * | 5/2005 | Kim et al. .................. 349/155 |
| 2005/0110922 | A1 | | 5/2005 | Lee et al. | |
| 2005/0147899 | A1 | | 7/2005 | Sun et al. | |
| 2005/0231669 | A1 | | 10/2005 | Kim | |

FOREIGN PATENT DOCUMENTS

| JP | 10-239669 | 9/1998 |
| JP | 11-278869 | 10/1999 |
| JP | 2000-206539 | 7/2000 |
| JP | 2001-013506 | 1/2001 |
| JP | 2001-305551 | 10/2001 |
| JP | 2005-024893 | 1/2005 |

(Continued)

OTHER PUBLICATIONS

Korean Office Action dated Mar. 28, 2012.

Primary Examiner — Dah-Wei Yuan
Assistant Examiner — Jose Hernandez-Diaz
(74) Attorney, Agent, or Firm — Morgan, Lewis & Bockius LLP

(57) ABSTRACT

A color filter substrate includes a substrate, a black matrix that defines cell areas on a substrate and prevents light leakage, a color filter formed in the cell areas defined by the black matrix, and a conductive thin film formed on the rear surface of the substrate for preventing the generation of static electricity, wherein the conductive thin film is formed of a photoresist containing a conductive material.

4 Claims, 25 Drawing Sheets

FOREIGN PATENT DOCUMENTS

| | | |
|---|---|---|
| JP | 2005-222930 | 8/2005 |
| JP | 2005-301289 | 10/2005 |
| KR | 10-2005-0100525 A | 10/2005 |
| WO | 2006/039230 | 4/2006 |

* cited by examiner

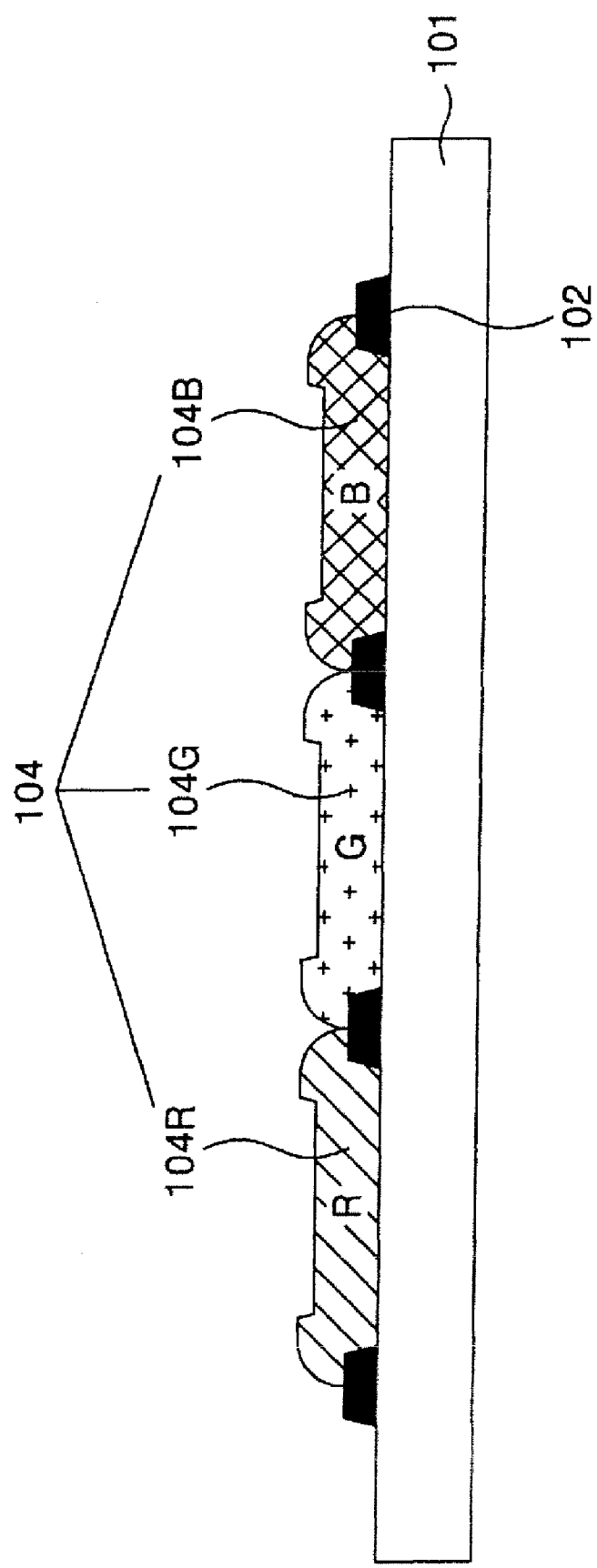

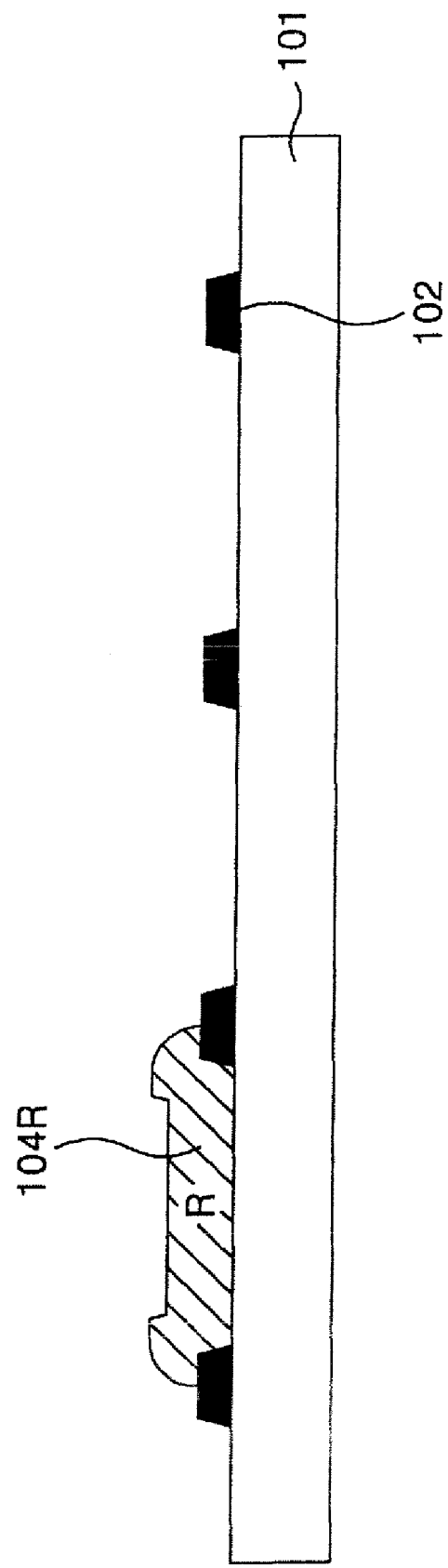

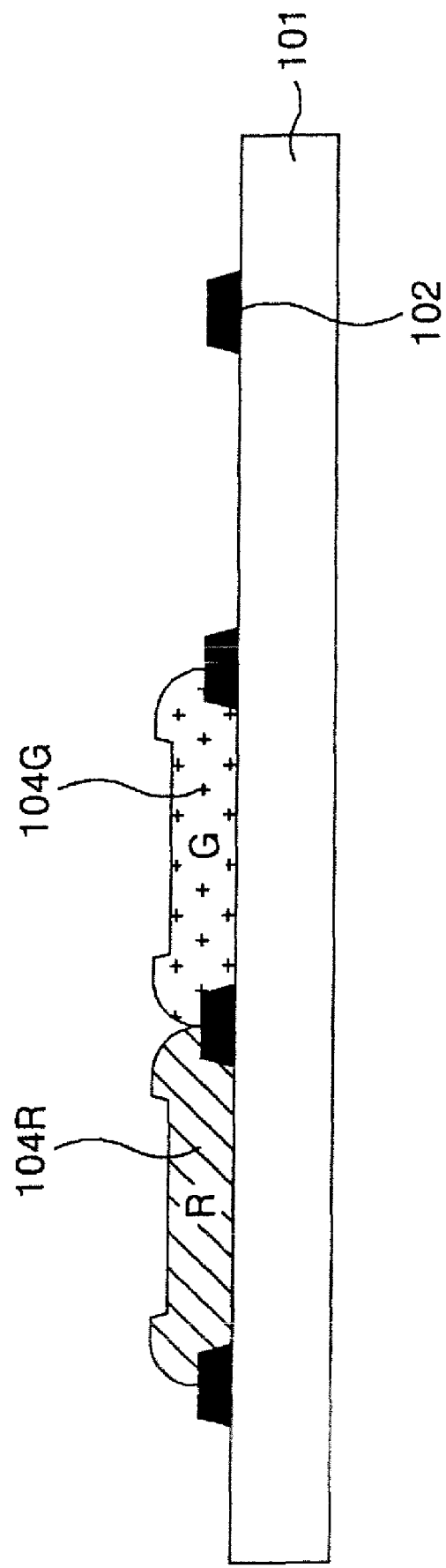

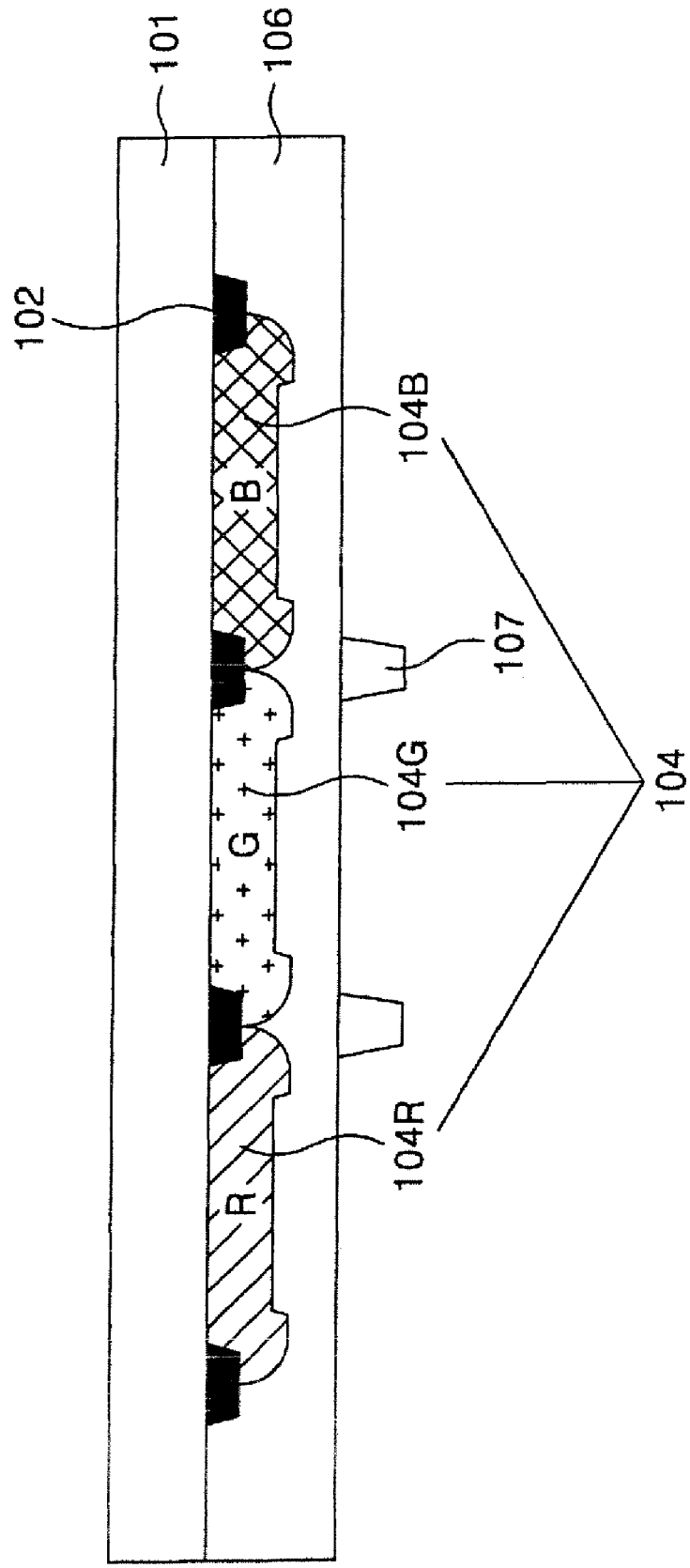

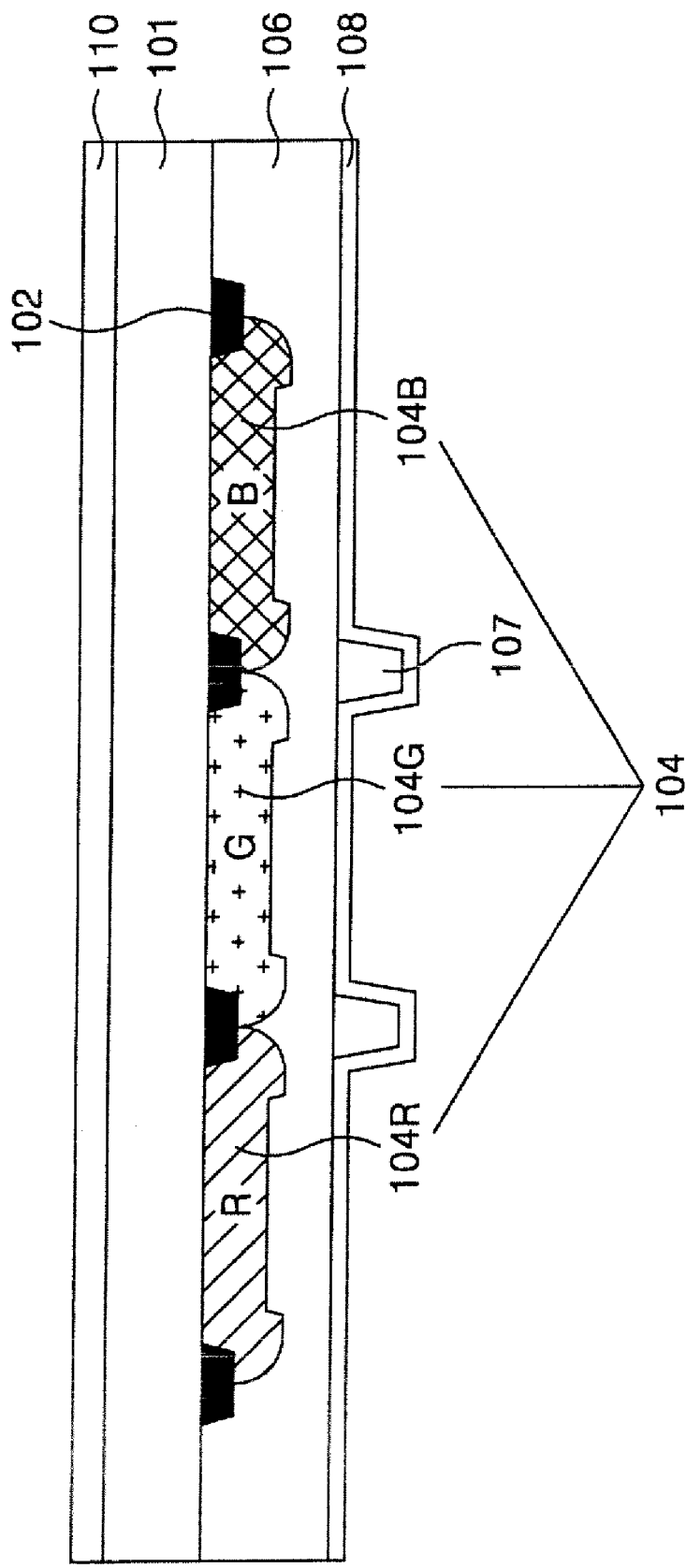

COLOR FILTER SUBSTRATE AND FABRICATING METHOD THEREOF

This is a divisional application of application Ser. No. 11/442,163, filed on May 30, 2006, now U.S. Pat. No. 7,799,392 which is hereby incorporated by reference.

This application claims the benefit of the Korean Patent Application No. P2005-0119956 filed on Dec. 8, 2005, which is hereby incorporated by reference in its entirety.

BACKGROUND OF THE INVENTION

1. Field of the Invention

The present invention relates to a component of a display device, and more particularly to a color filter substrate and a fabricating method thereof. Although the present invention is suitable for a wide scope of applications, it is particularly suitable for preventing static electricity on the color filter substrate.

2. Description of the Related Art

In general, a liquid crystal display device controls the light transmittance of liquid crystal using an electric field across a layer of liquid crystal molecules between two substrates to display a picture. The liquid crystal display device uses cells in an active matrix in which a switching device is formed in each of the cells. Liquid crystal display devices are used as display in televisions, computer monitors, office equipment, and cellular phones.

Liquid crystal display devices can be classified as either a vertical electric field type in which a vertical direction electric field extends between the two substrates or a horizontal electric field type is which a horizontal direction electric field extends across the surface of one of the two substrates. The vertical electric field type liquid crystal display device can drive a liquid crystal of TN (twisted nematic) mode with a vertical electric field between a common electrode on an upper substrate and a pixel electrode on a lower substrate. The vertical electric field type liquid crystal display device has an advantage in that the aperture ratio is high, but on the other hand, it also has a disadvantage in that the viewing angle is narrow, about 90°. The horizontal electric field type liquid crystal display device drives a liquid crystal of IPS (in-plane switch) mode with a horizontal electric field between a pixel electrode and a common electrode, which are formed in parallel on a lower substrate. The horizontal electric field type liquid crystal display device has an advantage in that the viewing angle is wide, about 160°, but on the other hand, it also has a disadvantage in that the aperture ratio is low.

FIG. 1 is a cross-sectional view representing a horizontal electric field type liquid crystal display device of the related art. As shown in FIG. 1, the horizontal electric field type liquid crystal display device includes a color filter substrate, a thin film transistor substrate and liquid crystal (not shown) injected into a gap between the substrates. The color filter substrate has a black matrix 4, a color filter 6, an overcoat layer 8, a spacer 13 and an upper alignment film 12 sequentially formed on an upper glass substrate 2. Further, a transparent electrode (ITO) 3 for preventing static electricity is formed on the other side of the glass substrate 2 of the color filter substrate. The thin film transistor substrate has a thin film transistor, a common electrode 10, a pixel electrode 56 and a lower alignment film 52 formed on a lower glass substrate 32.

The black matrix 4 of the color filter substrate overlaps the thin film transistors, gate lines (not shown) and data lines (not shown) of the lower glass substrate 32, and defines cell areas where color filters 6 are later formed. The black matrix 4 prevents light leakage and increases contrast ratio by absorbing external light. The color filters 6 are formed within the cell areas defined by the black matrix 4. The color filters 6 are red, green, and blue colored filters to realize red, green and blue colors.

The overcoat layer 8 covers a step difference formed by the color filter 6 to level the upper substrate 2. The spacer 13 maintains a cell gap between the upper and lower glass substrates 2 and 32. The spacer 13 can be simultaneously formed of the same material as the overcoat layer 8. The upper alignment film 12 is formed on the overcoat layer 8 where the spacer 13 is formed and initially aligns liquid crystal molecules interposed between the thin film transistor substrate and the color filter substrate in a designated direction. The lower alignment film 52 is formed on the passivation film 50, which covers the thin film transistor, and initially aligns the liquid crystal molecules interposed between the thin film transistor substrate and the color filter substrate in the designated direction.

The thin film transistor of the thin film transistor substrate includes a gate electrode 38 formed on the lower glass substrate 32 together with the gate line (not shown); a semiconductor layer 93, which overlaps the gate electrode 38 with the gate insulating film 34 therebetween; a source electrode 46 and a drain electrode 48. Contact semiconductor layers 92 reduce the contact resistance between the semiconductor layer 93 and each of the source and drain electrodes 46 and 48. In response to a gate signal from the gate line, a thin film transistor applies a pixel signal from the data line to the pixel electrode 56, which is connected to the drain electrode 48 through a contact hole in the protective passivation film 50.

The common electrode 10, which is a stripe type alternating with a pixel electrode 22, is simultaneously formed on the lower glass substrate 32 along with the gate line. A reference voltage that serves as a reference voltage upon driving of the liquid crystal 24 is supplied to the common electrode 10 through the common line. A horizontal electric field is formed between the pixel electrode 56 to which a pixel signal is supplied through the thin film transistor and the common electrode 10 to which a reference voltage is supplied through the common line. The horizontal electric field causes the liquid crystal molecules, which are initially arranged in a horizontal direction between the thin film transistor substrate and the color filter substrate, to rotate in a designated direction so as to change the light transmittance through the liquid crystal molecules, thereby realizing a picture.

FIGS. 2A to 2I illustrate a process of forming a color filter substrate for a horizontal electric field type liquid crystal display device of the related art. As shown in FIG. 2A, a static electricity prevention transparent conductive film ITO 3 is formed by a sputtering method on the glass substrate 2. More specifically, a high RF (DC) power is applied to a target opposite to the glass substrate 2, both of which are within a chamber filled with argon Ar gas. Ar molecules having a high energy in the plasma formed by the RF (DC) power lose (−) charge and collide with the target surface in an Ar+ state so the target particles come out of the target and are deposited onto the glass substrate 2, thereby forming the transparent conductive film (ITO) 3 for preventing static electricity buildup, as shown in FIG. 2B.

After forming the transparent conductive film 3 for preventing static electricity buildup, the black matrix 4 is formed on the glass substrate 2 to prevent light leakage. More specifically, an opaque material is spread on an other side of the glass substrate 2 opposite to the side of the glass substrate where the transparent conductive film 3 was formed. The opaque material is an opaque resin or an opaque metal, such as chrome Cr. Next, the opaque material is patterned by a photolithography process using masking and etching processes, thereby forming the black matrix 4, as shown in FIG. 2C. Red, green, and blue color filters are formed in cell areas defined by the black matrix after forming the black matrix 4.

Specifically, a red photo-sensitive color resin is deposited over the entire surface of the glass substrate 2 on which the black matrix 4 is formed. Next, the red photo-sensitive color resin is patterned by a photolithography process using masking and etching processes, thereby forming a red color filter R, as shown in FIG. 2D.

After forming the red color filter, a green photo-sensitive color resin is then deposited over the entire surface of the glass substrate 2 on which the red color filter R is formed. Then, the green photo-sensitive color resin is patterned by a photolithography process using masking and etching processes, thereby forming a green color filter G, as shown in FIG. 2E.

After forming the green color filter, a blue photo-sensitive color resin is deposited over the entire surface of the glass substrate 2 on which the red and green color filters R and G are formed. Then, the blue photo-sensitive color resin is patterned by the photolithography process using masking and etching processes, thereby forming a blue color filter B so as to complete the color filters 6, as shown in FIG. 2F.

Subsequently, the overcoat layer 8 for providing a planar surface is formed, as shown in FIG. 2G, after forming the R, G, B color filters 6. More specifically, an organic insulating material is coated over the entire surface of the glass substrate 2 on which the color filters 6 are formed. Then, the organic insulating material is patterned by a photolithography process using a masking and an etching process, thereby forming the overcoat layer 8 having a planar surface over step differences formed by the color filters 6.

After forming the overcoat layer, a spacer 13 is then formed for maintaining a cell gap between the thin film transistor and the color filter substrate, as shown in FIG. 2H. More specifically, the same organic insulating material used for forming the overcoat layer 8 is coated over the entire surface of the glass substrate 2 on which the overcoat layer 8 is formed. Then, the organic insulating material is patterned by a photolithography process using masking and etching processes, thereby forming the spacer 13 to maintain the cell gap, as shown in FIG. 2H.

After forming the spacer 13, an alignment film 12 for initially aligning liquid crystal molecules in a designated direction is formed over the surface of the glass substrate 2 on which the spacer 13 is formed, as shown in FIG. 2I, thereby completing the color filter substrate.

In the related art, in the case of fowling the color filter substrate by the fabrication process described above, the transparent conductive film (ITO) 3 on the rear surface of the glass substrate 2 is formed by a sputtering process, which is a complicated process step that requires a large amount of time. Further, in the case of forming the color filter substrate of the related art with a transparent conductive film 3 on the rear surface of the glass substrate 2, there is a problem in that it is impossible to make the color filter substrate light and thin because the glass substrate 2 can not be etched after the black matrix, the color filter, the overcoat layer and the alignment film are formed on the other side of the glass substrate when the transparent conductive film 3 is on the rear surface of the glass substrate 2.

SUMMARY OF THE INVENTION

Accordingly, the present invention is directed to a color filter substrate and a fabricating method thereof that substantially obviates one or more of the problems due to limitations and disadvantages of the related art.

Accordingly, it is an object of the present invention to provide a color filter substrate and a fabricating method thereof that has a reduced fabrication time for forming a conductive thin film to prevent static electricity on the rear surface of a substrate.

It is another object of the present invention to provide a color filter substrate and a fabricating method thereof in which the substrate is light and thin.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a color filter substrate includes a substrate, a black matrix that defines cell areas on a substrate and prevents light leakage, a color filter formed in the cell areas defined by the black matrix, and a conductive thin film formed on the rear surface of the substrate for preventing the generation of static electricity, wherein the conductive thin film is formed of a photo-resist containing a conductive material.

In another aspect, a fabricating method of a color filter substrate includes forming a black matrix that defines cell areas on a substrate and prevents light leakage, forming color filters in the cell areas defined by the black matrix, and forming a conductive thin film on the rear surface of the substrate for preventing the buildup of static electricity, wherein the conductive thin film is formed of a photo-resist containing a conductive material.

In another aspect, a color filter substrate includes a substrate, a black matrix that defines cell areas on the substrate and prevents light leakage, a color filter formed in the cell areas defined by the black matrix, and a conductive thin film formed on the rear surface of the substrate for preventing the generation of static electricity, wherein the conductive thin film is formed of a photo-resist containing a carbon nano tube.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 6B is a cross-sectional view of the color filter substrate taken along the line II-II' in FIG. 6A;

FIGS. 7A to 7C illustrate a process of forming color filters in cell areas defined by a black matrix;

FIG. 8B is a cross-sectional view of the color filter substrate taken along the line III-III' in FIG. 8A;

FIGS. 10A and 10B are a plan view and a cross-sectional view, respectively, of the color filter substrate in which a conductive thin film is formed on the rear surface of a glass substrate according to an embodiment of the present invention.

DETAILED DESCRIPTION OF THE PREFERRED EMBODIMENT

Reference will now be made in detail to the preferred embodiments of the present invention, examples of which are illustrated in the accompanying drawings.

Figure 1:
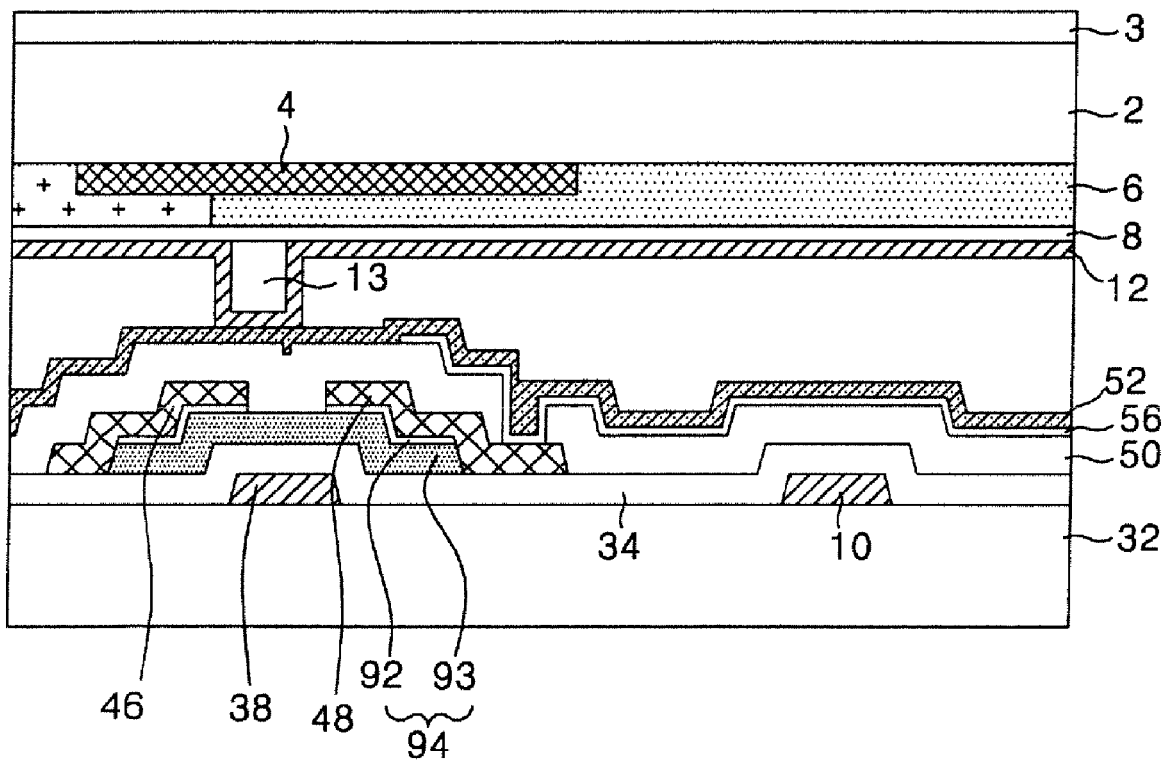
FIG. 1 is a cross-sectional view representing a horizontal electric field type liquid crystal display device of the related art.
Figure 2A:
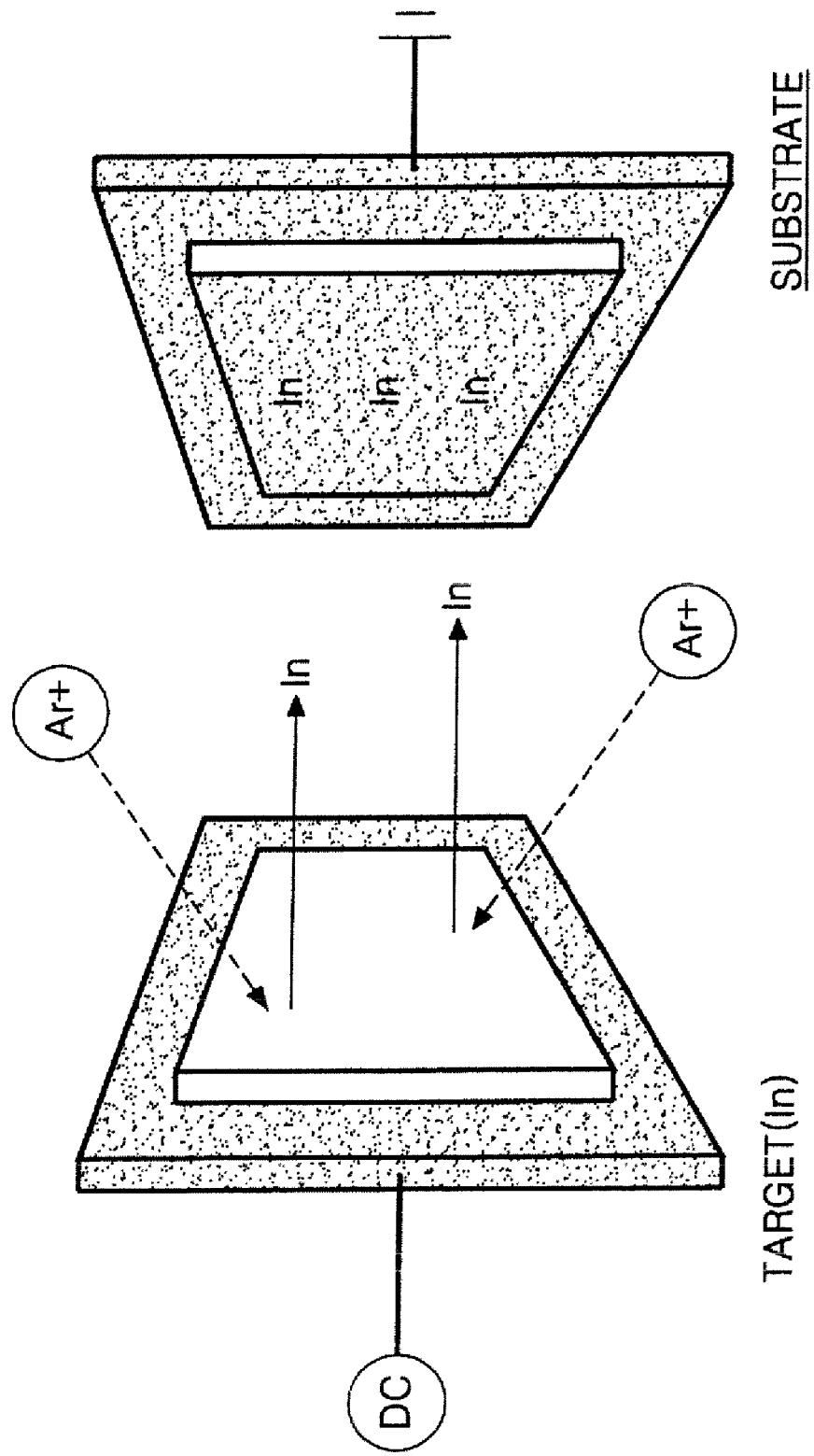
FIGS. 2A to 2I illustrate a process of forming a color filter substrate for a horizontal electric field type liquid crystal display device of the related art.
Figure 2B:
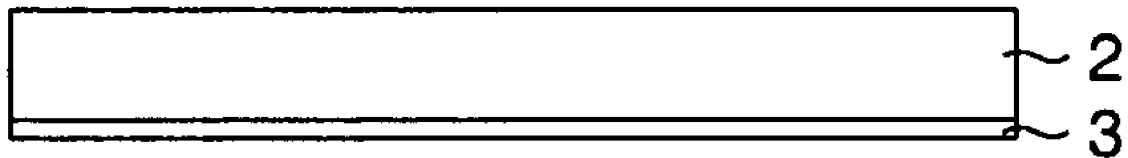
Figure 2C:
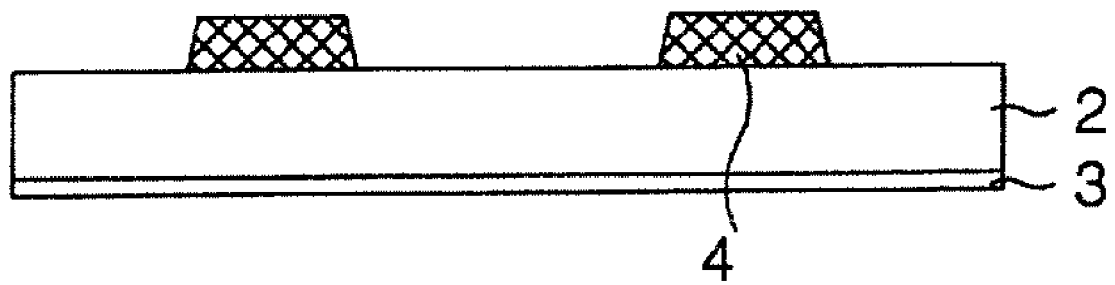
Figure 2D:
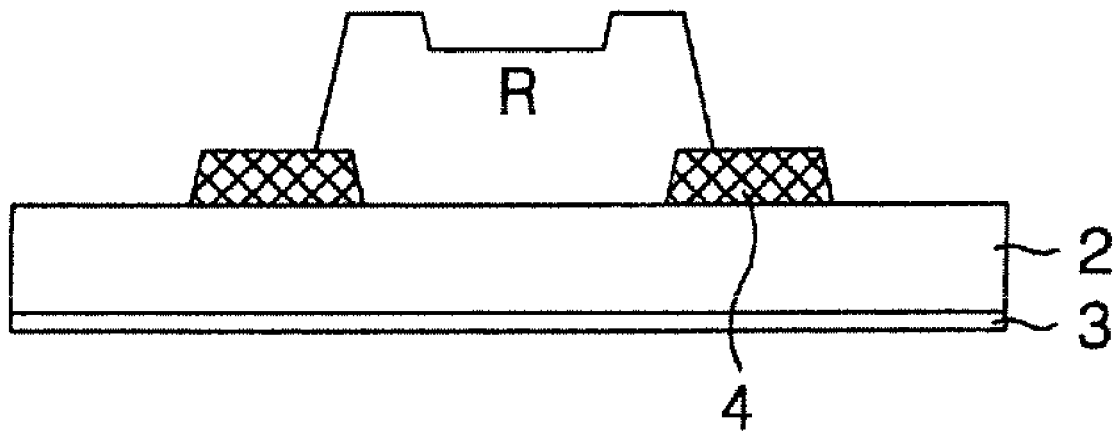
Figure 2E:
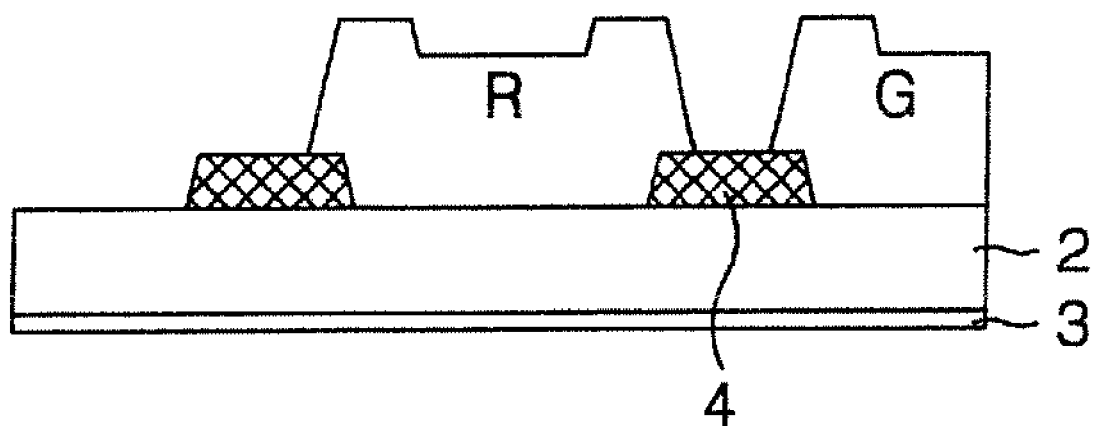
Figure 2F:
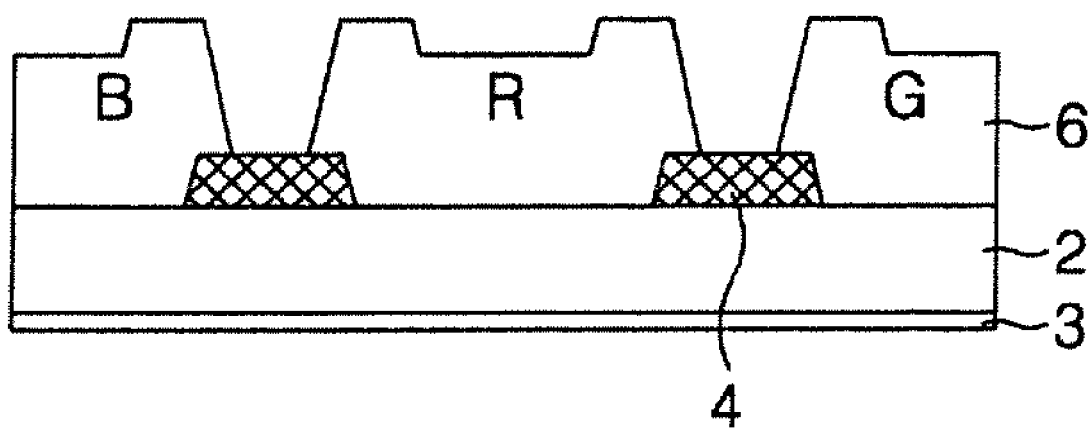
Figure 2G:
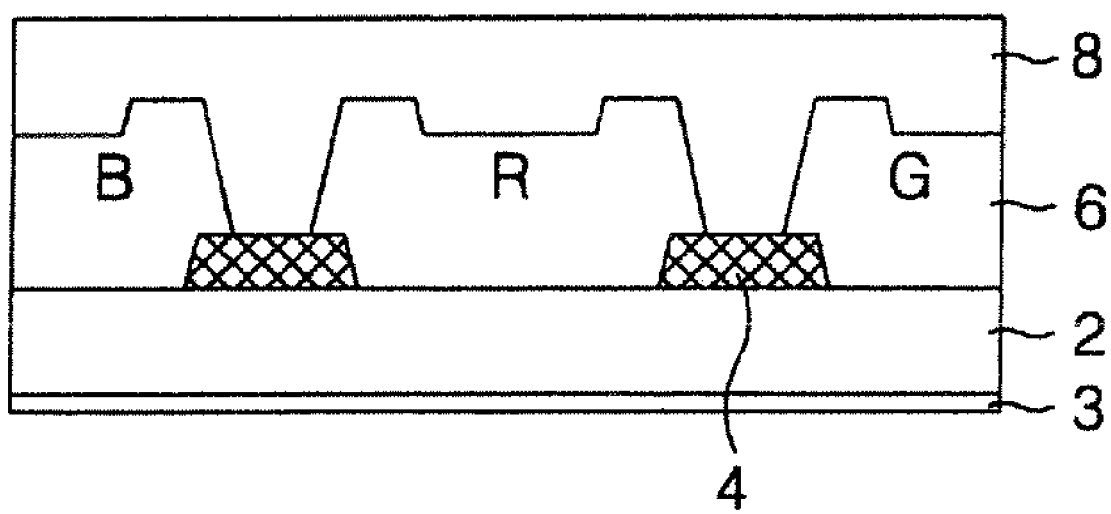
Figure 2H:
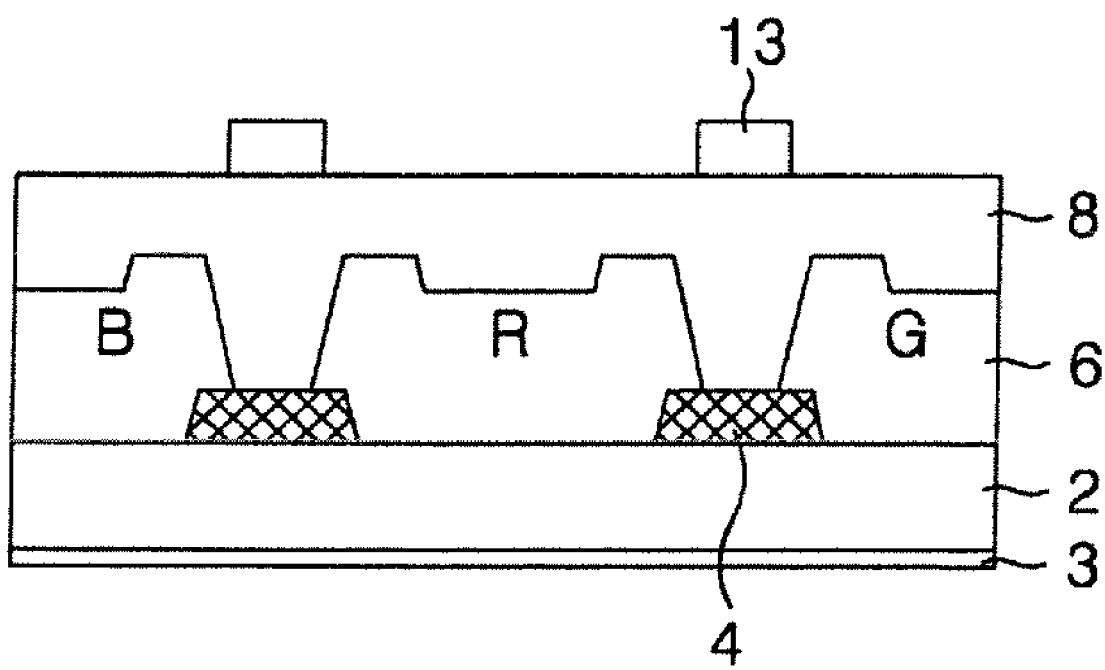
Figure 2I:
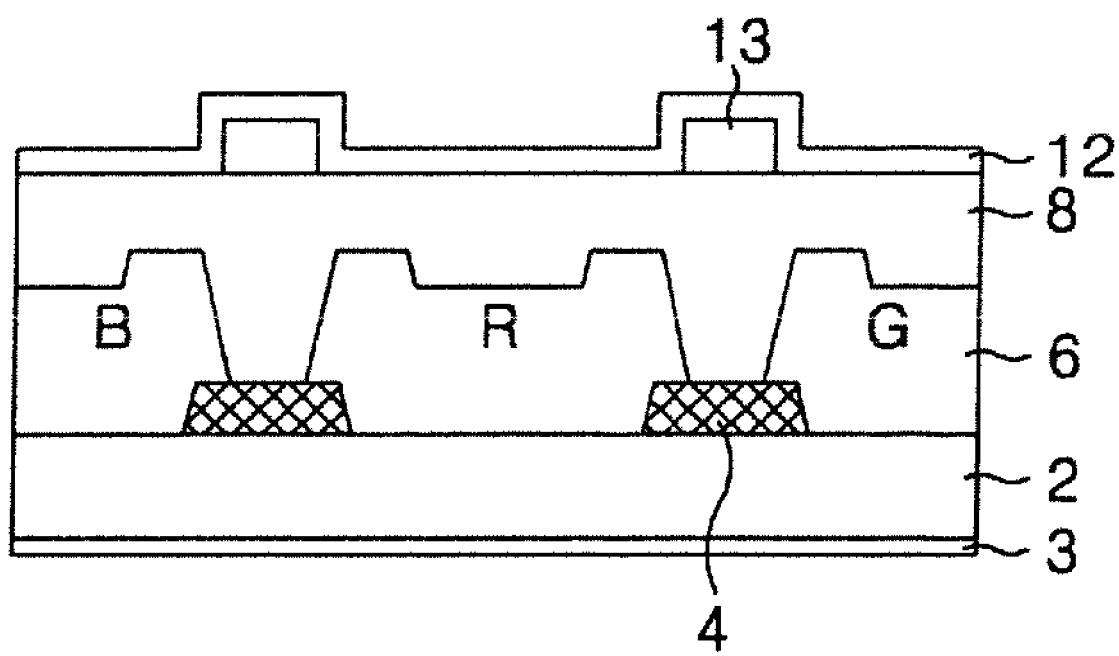
Figure 3:
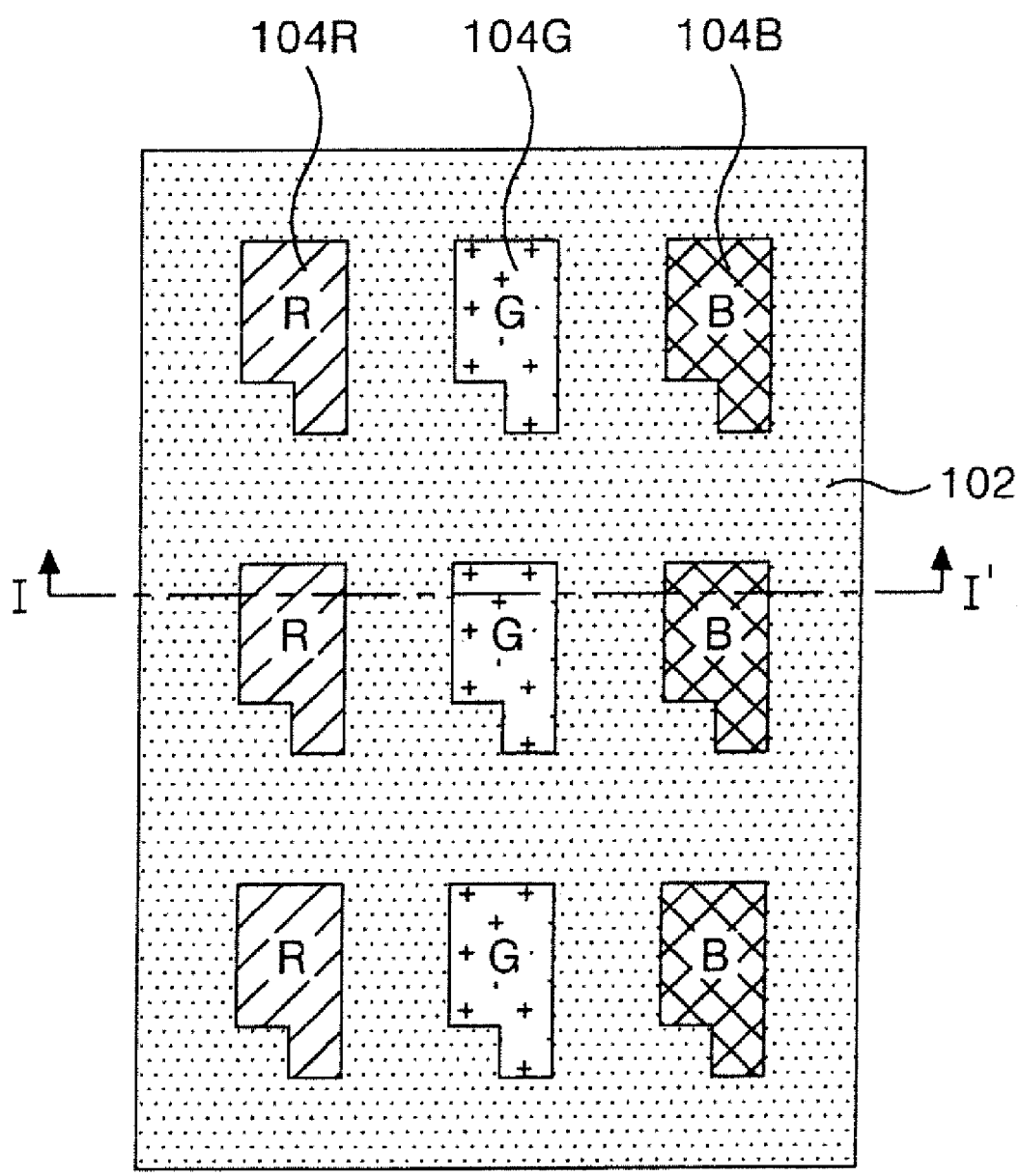
FIG. 3 is a plan view of the color filter substrate for a horizontal electric field type liquid crystal display device according to an embodiment of the present invention.
Figure 4:
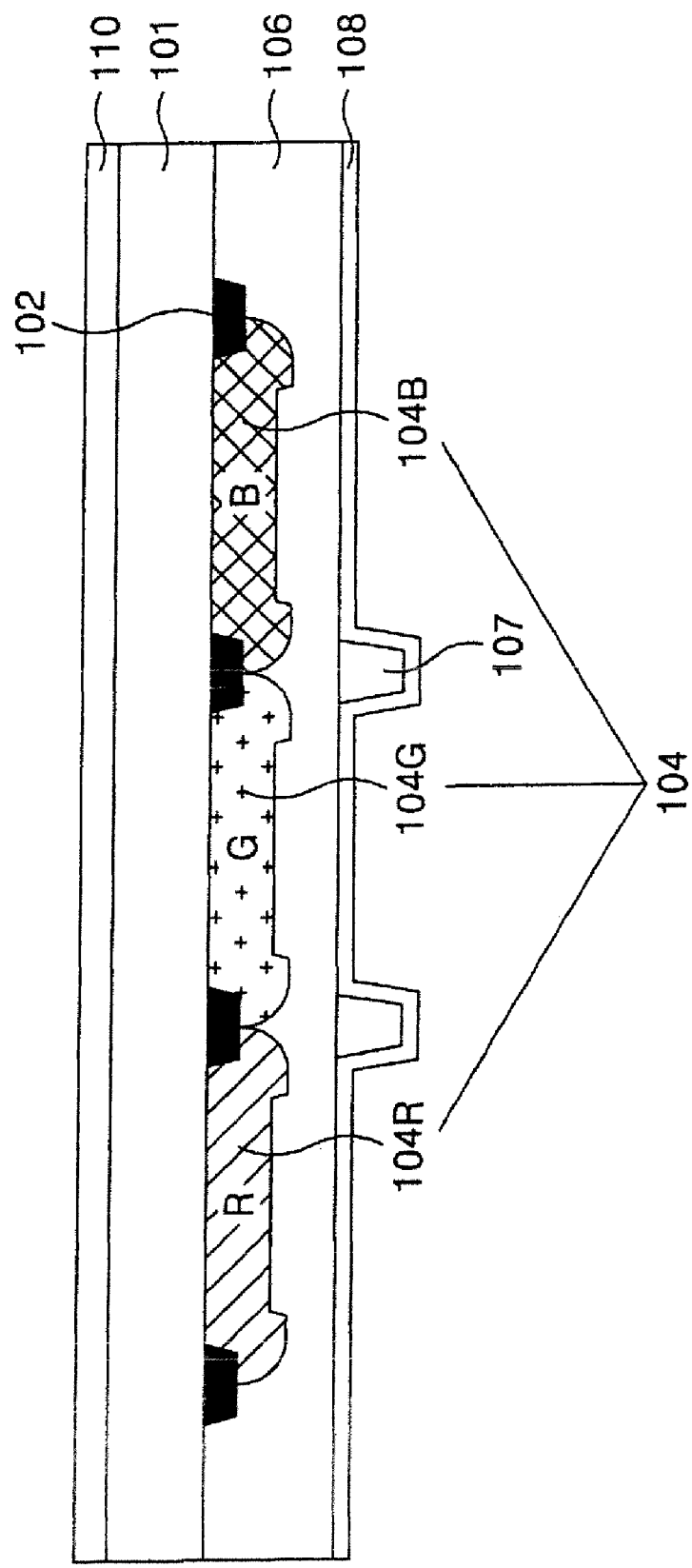
FIG. 4 is a cross-sectional view of a color filter substrate taken along the line I-I' of FIG. 3.

FIG. 3 is a plan view of a color filter substrate according to an embodiment of the present invention, and FIG. 4 is a cross-sectional view of the color filter substrate taken along the line I-I' in FIG. 3. As shown in FIGS. 3 and 4, the color filter substrate according to the present invention includes a black matrix 102 formed on the substrate 101; color filters 104 formed in cell areas defined by the black matrix 102; an overcoat layer 106 which covers a step difference formed by the color filters 104 to form a planar surface; an alignment film 108 formed on the overcoat layer 106 to initially align liquid crystal molecules in a designated direction; and a conductive thin film 110 formed on the rear surface of the substrate 101 to prevent the generation of static electricity. A color filter substrate according to an embodiment of the present invention might further include a spacer 107 formed on the overcoat layer 106 to maintain a cell gap into which liquid crystal is filled.

Herein, the black matrix 102 is formed in a matrix shape on the substrate 101 to divide a plurality of cell areas where the color filters 104 are to be formed, and at the same time, the black matrix 102 acts to prevent light interference between adjacent cell areas. Thus, the black matrix 102 is formed to overlap the gate line, the data line and the thin film transistor except the pixel electrode of the thin film transistor substrate. The black matrix 102 is formed by patterning an opaque metal by a photolithography process and an etching process after depositing the opaque metal, such as chrome Cr or CrOx, on the substrate 101 to have a line width of 5~25 μm and a thickness of about 1500~2000 Å. In the alternative, the black matrix 102 might be formed by patterning an insulating resin by a photolithography process and an etching process after forming the insulating resin on the substrate 101 to have a thickness of 1.0~1.5 μm and a line width of 5~25 μm.

The color filters 104 are formed in the cell areas defined by the black matrix 102. At this moment, a photo-sensitive color resin is patterned by the photolithography process using masking and etching processes after sequentially spraying the photo-sensitive color resin having red, green and blue colors on the substrate 101 by a pigment spraying method, thereby forming the color filters including a red color filter 104R realizing red color, a green color filter 104G realizing green color, and a blue color filter 104B realizing blue color.

The method of realizing the color filters 104 is not limited to the pigment spraying method, which uses the photo-sensitive color resin, and the color filters 104 can be formed by various methods other than the pigment spraying method, such as a dyeing method, an electrophoretic deposition method, or a printing method.

The overcoat layer 106 removes the stepped difference formed by the color filters 104 by having a planar upper surface such that the alignment film 108 formed by a subsequent process can be made on a flat surface.

The spacer 107 performs the role of maintaining a cell gap into which a liquid crystal is filled between the thin film transistor and the color filter substrate. The spacer 107 can be formed of the same material as the overcoat layer 106 that overlaps the black matrix 104.

The alignment film 108 is formed on the overcoat layer 106 on which the spacer 107 is formed to initially align liquid crystal molecules in a designated direction. The alignment film 108 includes a rubbing process of an organic alignment film, such as polyimide, to form an alignment groove (not shown) for aligning liquid crystal in the designated direction.

The conductive thin film 110 is formed on the rear surface of the color filter substrate by a coating process using a photo-resist containing a conductive material to prevent the generation of static electricity on the color filter substrate. The conductive material contained in the photo-resist is a carbon nano tube. A carbon nano tube is a carbon allotrope made of carbon, which exists in great quantity in the earth, and the carbon nano tube is a material where one carbon is combined with another carbon atom in a hexagonal honeycomb shape to form a tube shape and the diameter of the tube is about a nanometer (nm=1/1,000,000,000 meter). The carbon nano tube is similar in electrical conductivity to copper. The thermal conductivity of carbon nano tube is the best in the natural world. The strength of carbon nano tube is the same as diamond.

A coating process and a heat treatment process are performed after positioning the liquid photo-resist, which contains the carbon nano tube having the conductivity described above, on the rear surface of the substrate 101, thereby forming the conductive film 110 on the rear surface of the substrate 101 for preventing static electricity. Hereinafter, in reference to the accompanying drawings, a fabricating method of a color filter substrate for a horizontal electric field type liquid crystal display device according to an embodiment of the present invention will be explained in detail.

Figure 5A:
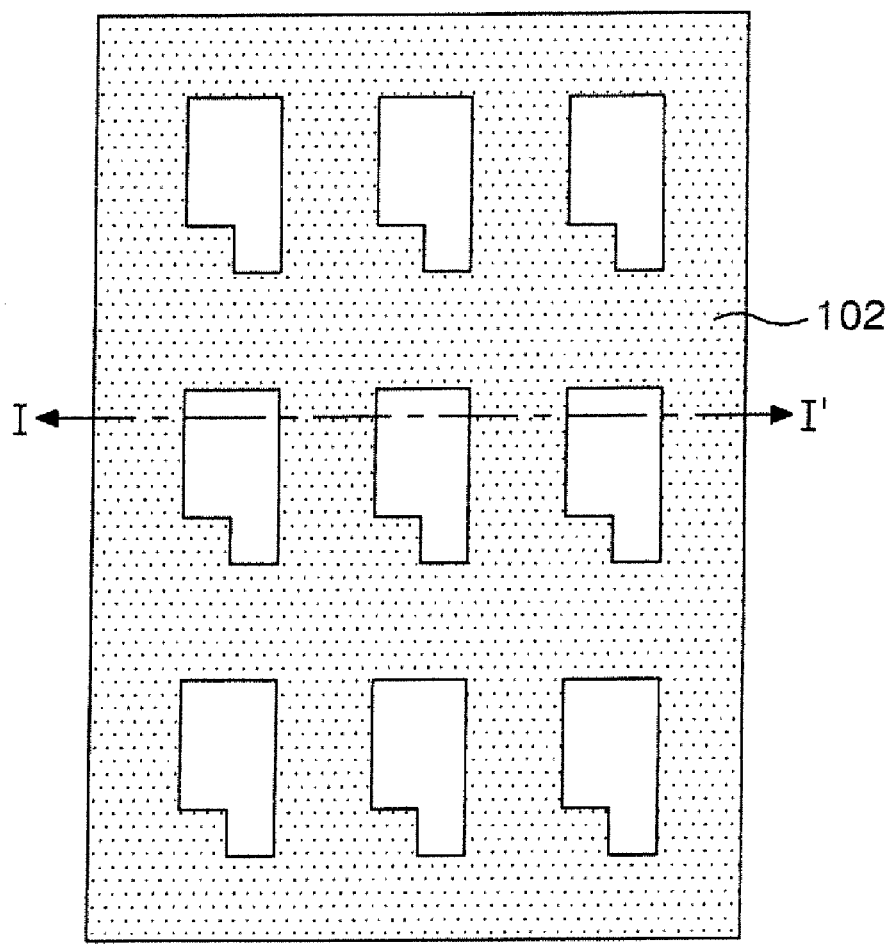
FIGS. 5A and 5B are a plan view and a cross-sectional view, respectively, of the color filter substrate in which a black matrix is formed according to an embodiment of the present invention.
Figure 5B:
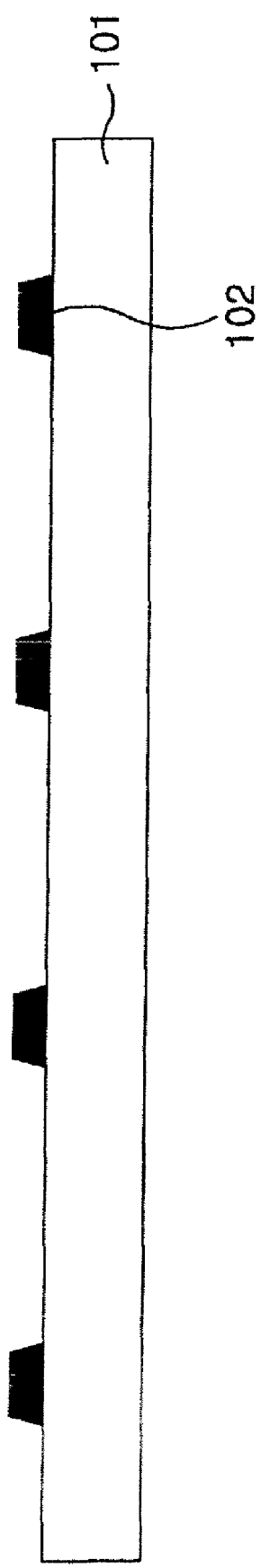

FIGS. 5A and 5B are a plan view and a cross-sectional view, respectively, of the color filter substrate in which a black matrix is formed according to an embodiment of the present invention. As shown in FIGS. 5A and 5B, an opaque metal such as chrome Cr or CrOx is deposited on the substrate 101 of color filter substrate with a line width of about 5~25 μm and a thickness of about 1500~2000 Å. More specifically, a photolithography process using a masking process and an etching process are performed on the opaque metal, which is deposited on the substrate 101, thereby forming a black matrix 102, which defines a plurality of cell areas in which color filters 104 are later formed. In the alternative, the black matrix 102 might be formed by patterning an insulating resin by a photolithography process and an etching process after forming the insulating resin on the substrate 101 to have a thickness of 1.0~1.5 μm and a line width of 5~25 μm. The black matrix 102 also acts to prevent light interference between adjacent cell areas as well as improve the contrast ratio.

Figure 6A:
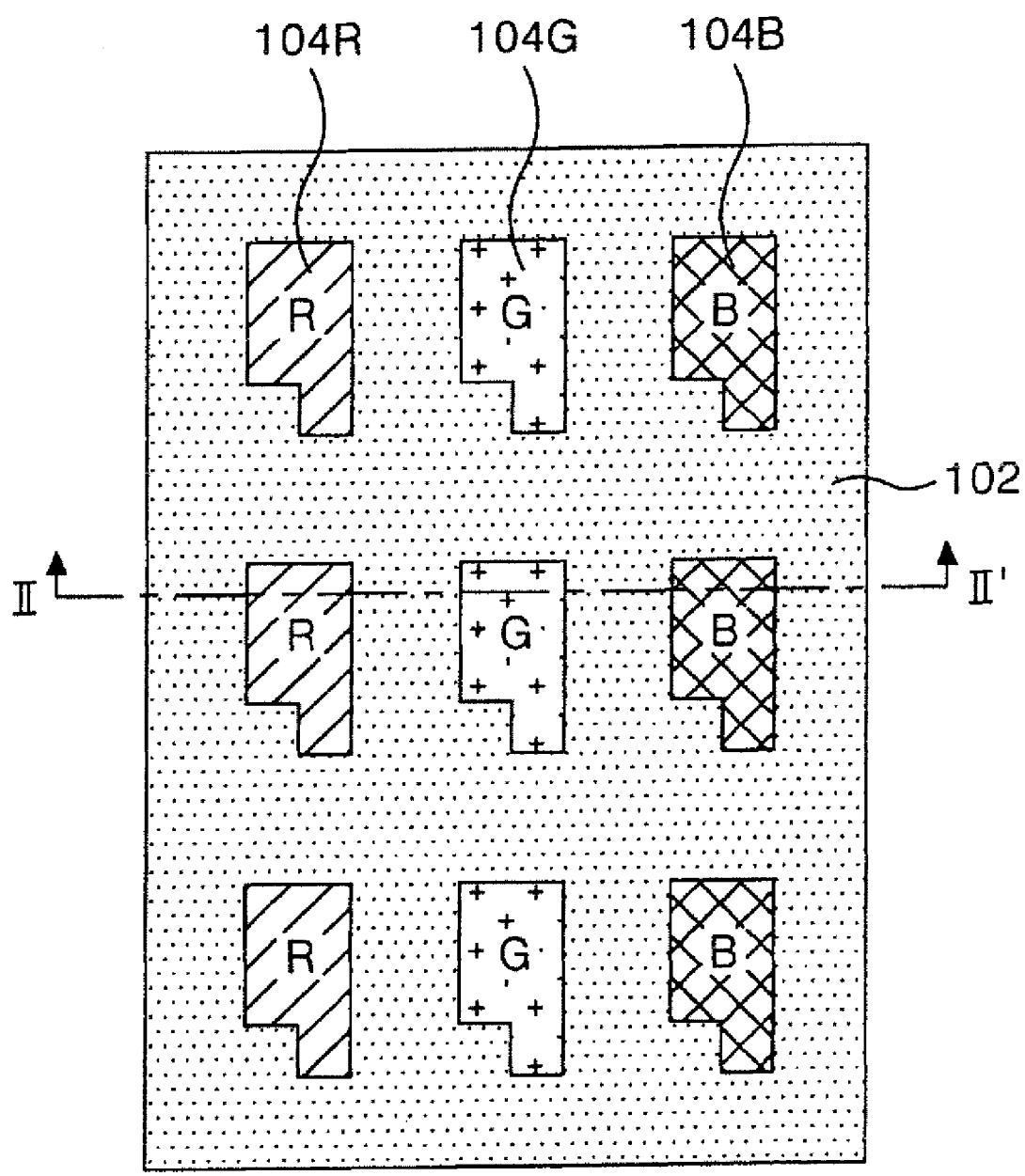
FIG. 6A is a plan view of a color filter substrate where the color filters are formed according to an embodiment of the present invention.

FIG. 6A is a plan view of a color filter substrate where the color filters are formed according to an embodiment of the present invention, and FIG. 6B is a cross-sectional view of the color filter substrate taken along the line II-II' in FIG. 6A. After forming the black matrix 102 on the substrate 101, the color filter is formed in the cell areas, which are defined by the black matrix, as shown in FIGS. 6A and 6B. More specifically, a photo-sensitive color resin is patterned by a photolithography process using a masking and an etching process after sequentially spraying the photo-sensitive color resin having red, green and blue colors by a pigment spraying method on a surface of the substrate 101 on which the black matrix 102 is formed, thereby forming the color filters 104 of a red color filter 104R, a green color filter 104G, and a blue color filter 104B.

Figure 7C:
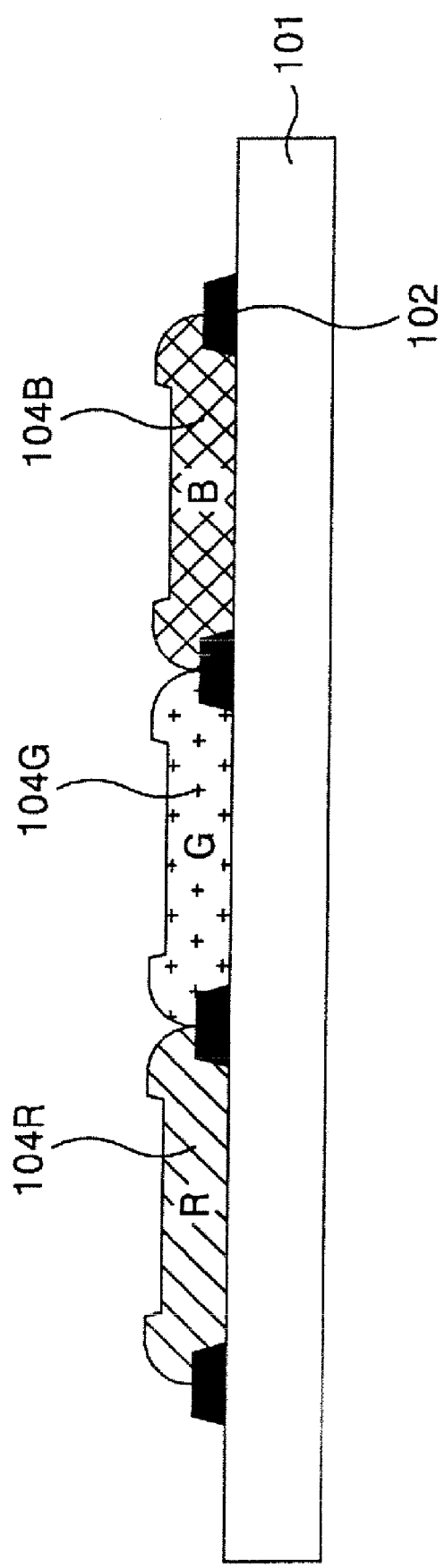

FIGS. 7A to 7C illustrate a process of forming color filters in cell areas defined by a black matrix. More specifically, the red photo-sensitive color resin is spread by the pigment spraying method over the entire surface of the substrate 101. Then, the red photo-sensitive color resin is patterned by a photolithography process using masking and etching processes, thereby forming the red color filter 104R, which shows the red color in the cell areas defined by the black matrix 102, as shown in FIG. 7A.

After forming the red color filter as described above, the green photo-sensitive color resin is spread by the pigment spraying method over the entire surface of the substrate 101, as shown in FIG. 7B. Then, the green photo-sensitive color resin is patterned by the photolithography process using masking and etching processes, thereby forming the green color filter 104G, which shows the green color in the cell areas defined by the black matrix 102, as shown in FIG. 7B.

After forming the red and green color filters as described above, the blue photo-sensitive color resin is spread by the pigment spraying method on the entire surface of the substrate 101. Then, the blue photo-sensitive color resin is patterned by the photolithography process using masking and etching processes, thereby forming the blue color filter 104B, which shows the blue color in the cell areas defined by the black matrix 102 so as to form the color filters 104 on the glass substrate 101, as shown in FIG. 7C.

Figure 8A:
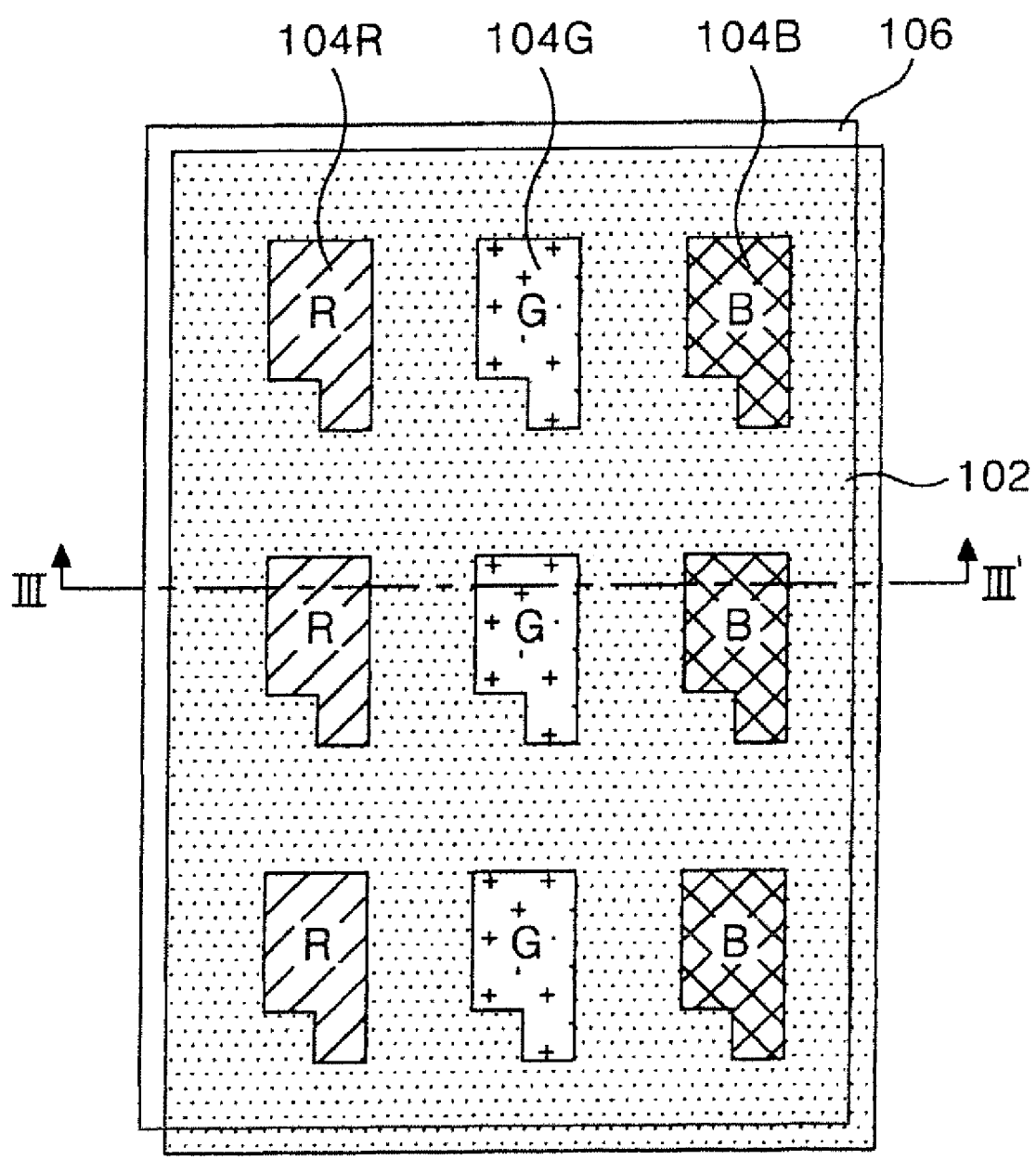
FIG. 8A is a plan view of the color filter substrate in which the overcoat layer is formed according to an embodiment of the present invention.

FIG. 8A is a plan view of the color filter substrate in which the overcoat layer is formed according to an embodiment of the present invention, and FIG. 8B is a cross-sectional view of the color filter substrate taken along the line III-III' in FIG. 8A. After forming the color filters in the cell areas defined by the black matrix, the overcoat layer 106 is formed to have a planar top surface covering the step differences formed on the substrate 101 by the color filters 104, as shown in FIGS. 8A and 8B.

Referring to FIGS. 8A and 8B, a thermosetting resin, such as polydimethylsiloxane PDMS, is formed over the entire surface of the substrate 101 on which the color filters 104 are formed to cover the step difference formed by the color filters 104. Thus, the overcoat layer 106 provides a planar top surface for the later formed alignment film 108. More specifically, a thermosetting resin is provided on the substrate 101 and then patterned by a photolithography process using masking and etching processes, thereby forming the overcoat layer 106 on a surface of the substrate 101 on which the color filters 104 are formed. The spacer 107, which performs the role of maintaining a cell gap, is then formed on the planar top surface of the overcoat layer.

Figure 9A:
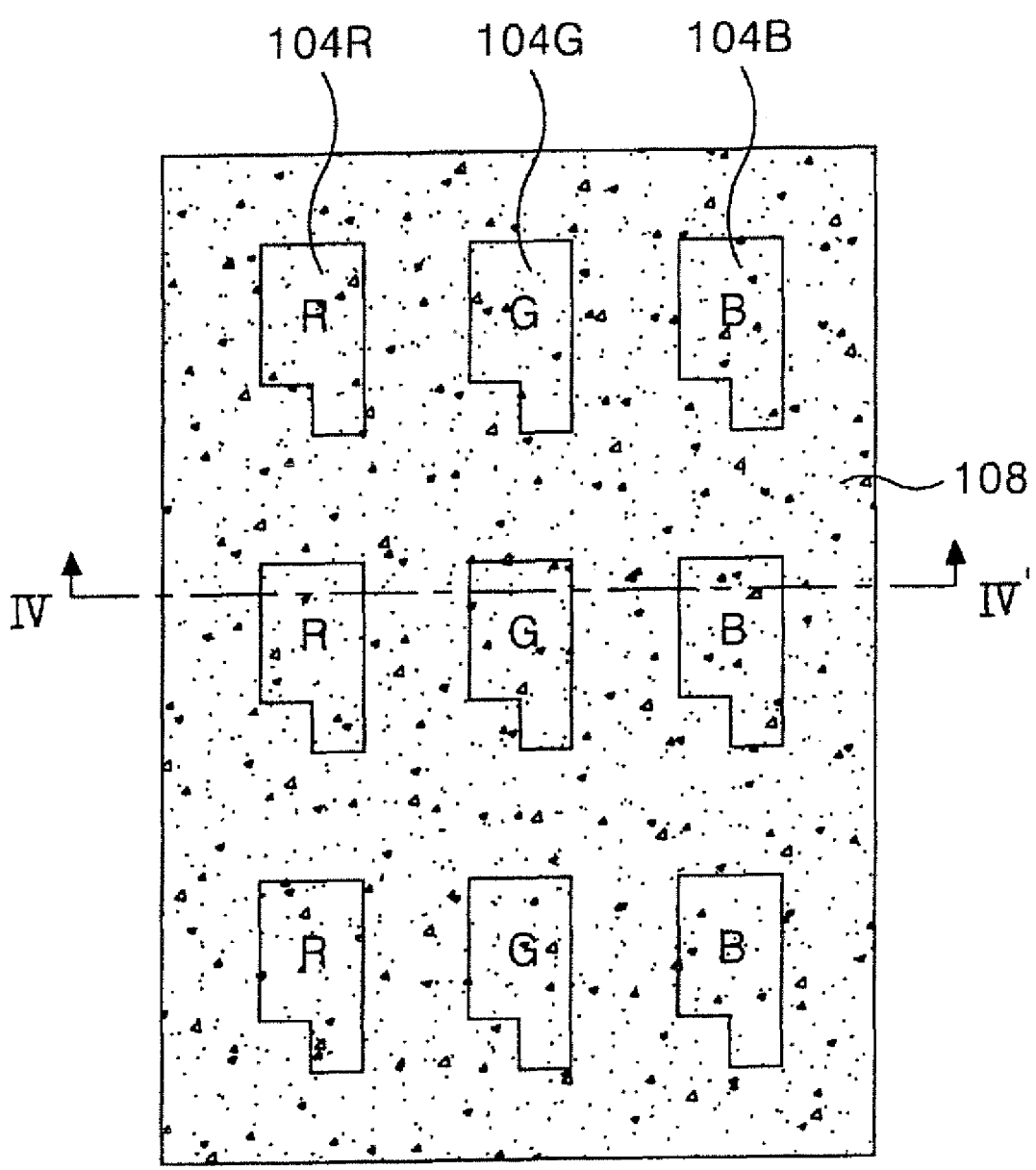
FIGS. 9A and 9B are a plan view and a cross-sectional view, respectively, of the color filter substrate where an alignment film is formed according to and embodiment of the present invention.
Figure 9B:
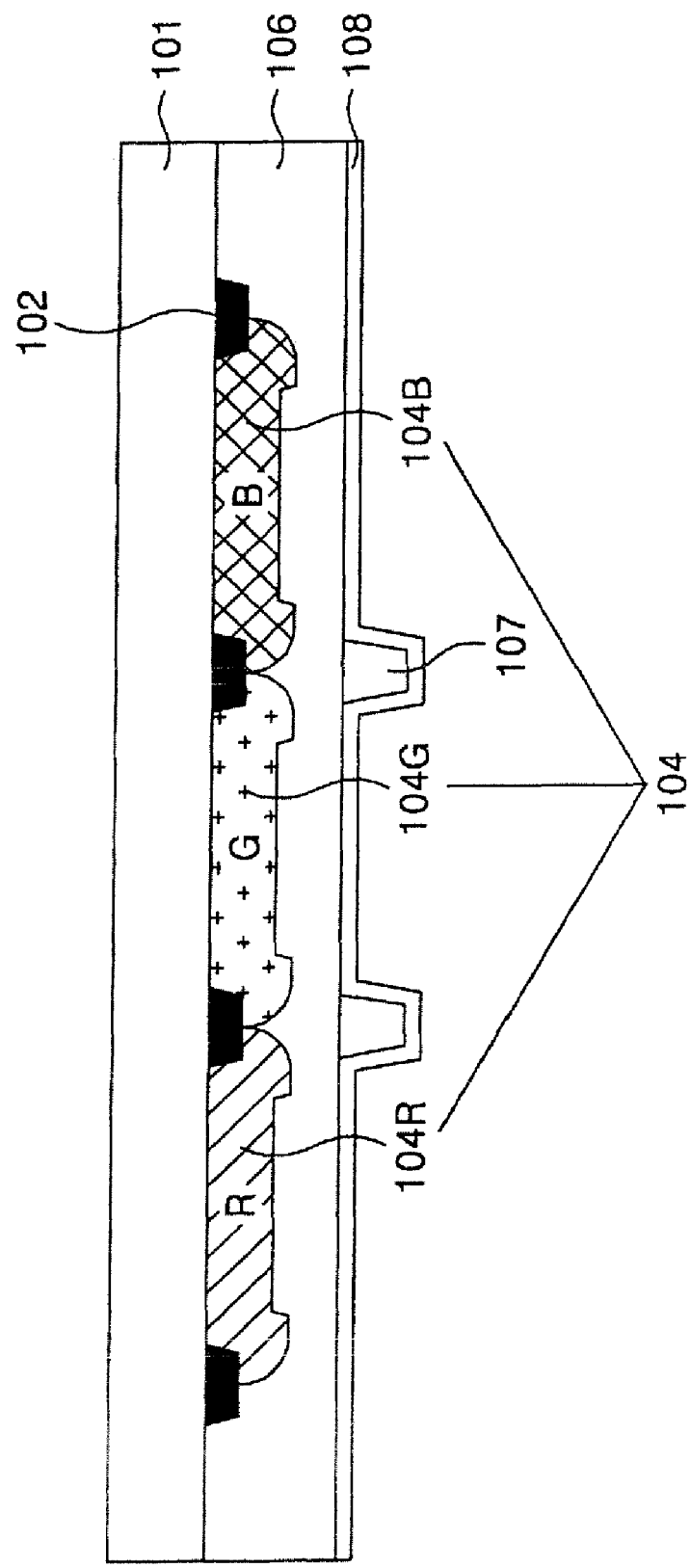

FIG. 9A is a plan view of the color filter substrate on which the alignment film is formed according to an embodiment of the present invention, and FIG. 9B is a cross-sectional view of the color filter substrate taken along the line IV-IV' in FIG. 9A. After forming the overcoat layer 106 and the spacer 107, the alignment film 108 for aligning liquid crystal molecules in the designated direction is formed on the overcoat layer 106. Referring to FIGS. 9A and 9B, an organic alignment film, such as polyimide, is spread over the entire surface of the substrate on which the overcoat layer 106 is formed. Then, a rubbing process is performed on the organic alignment film, thereby forming the alignment film 108 having alignment grooves, which initially align the liquid crystal molecules in a designated direction.

Figure 10A:
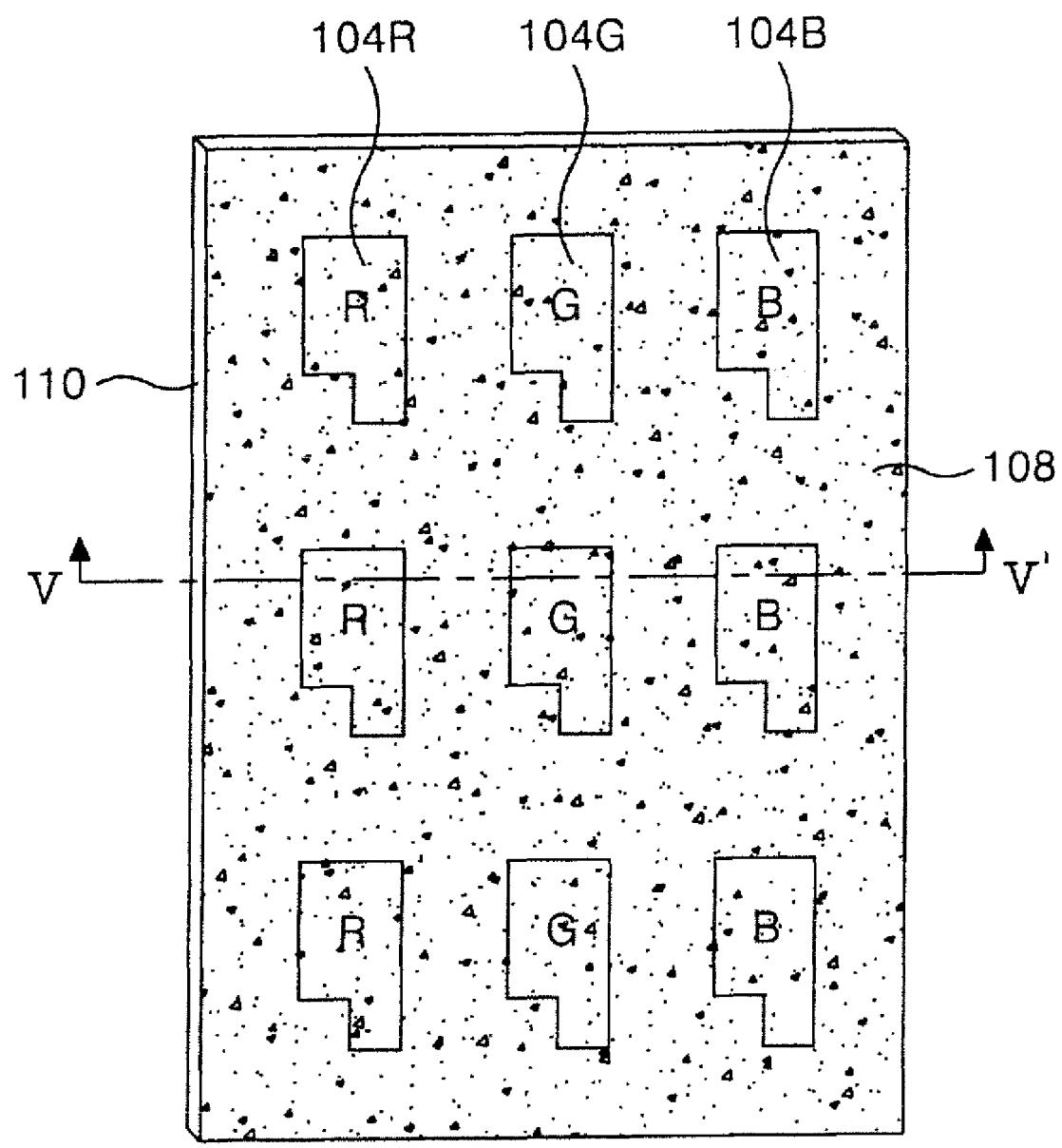

FIG. 10A is a plan view of the color filter substrate in which a conductive thin film is formed, and FIG. 10B is a cross-sectional view of the color filter substrate taken along the line V-V' in FIG. 10A. After forming the alignment film as described above, a conductive thin film for preventing static electricity buildup is formed on the rear surface of the substrate 101. Referring to FIGS. 10A and 10B, the conductive thin film 110 for preventing the static electricity buildup is formed on the rear surface of the substrate 101 by a coating process using a photo-resist PR containing a conductive material. More specifically, a liquid photo-resist PR, containing carbon nano tube as a conductive material, is put on the rear surface of the substrate 101 by a coating process. An etching process can be performed on the substrate 101 to make the color filter substrate light and thin before forming the conductive thin film 110 on the rear surface of the substrate 101.

The carbon nano tube is a carbon allotrope made of carbon, and the carbon nano tube is a material where one carbon is combined with other carbon atom in a hexagonal honeycomb shape to form a tube shape and the diameter of the tube is about a nanometer (nm=1/1,000,000,000 meter). The carbon nano tube is similar in electrical conductivity to copper. The thermal conductivity of carbon nano tube is the best in the natural world. The strength of carbon nano tube is the same as diamond.

The coating process is performed on the photo-resist by use of a rotation chuck (not shown), which holds the substrate 101, thereby spreading the liquid photo-resist containing the conductive material over the entire rear surface of the substrate 101. Then, the liquid photo-resist is hardened with a heat treatment, thereby forming the conductive thin film 110 on the rear surface of the color filter substrate to prevent the buildup of static electricity.

As described above, the color filter substrate and the fabricating method thereof according to the present invention forms a conductive thin film by using a photo-resist containing the conductive material on the rear surface of the substrate, thereby providing a quick and easy method, as compared to the related art, for forming a static electricity buildup prevention film. Further, embodiments of the present invention perform the etching process on the color filter substrate before forming the conductive thin film on the rear surface of the color filter substrate for preventing the static electricity buildup such that the color filter substrate can be made light and thin.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A fabricating method of a color filter substrate, the method comprising:
    forming a black matrix that defines cell areas on a substrate and prevents light leakage;
    forming color filters in the cell areas defined by the black matrix;
    forming an overcoat layer with a planar surface over the color filters, the overcoat later being formed of polydimethylsiloxane;
    forming a spacer on the overcoat layer for maintaining a cell gap, the spacer being formed of the same material as the overcoat layer;
    forming an alignment film on the overcoat layer for aligning liquid crystal molecules in a designated direction;
    rubbing the alignment film; and
    forming a conductive thin film on a rear surface of the substrate for preventing the buildup of static electricity, the conductive thin film being formed of a photo-resist containing a conductive material.

2. The fabricating method according to claim 1, further comprising etching the rear surface of the substrate before the conductive thin film is formed thereon.

3. The fabricating method according to claim 1, wherein the forming the conductive thin film includes:
    positioning a liquid photo-resist containing the conductive material on the rear surface of the substrate;
    spreading the photo-resist on the rear surface of the substrate to coat the rear surface of the substrate with the photo-resist; and
    heating the liquid photo-resist spread on the rear surface of the substrate to harden the photo-resist.

4. The fabricating method according to claim 1, wherein the conductive material contained in the photo-resist includes carbon nano tube.

* * * * *